United States Patent
Mori et al.

(10) Patent No.: US 6,462,622 B1
(45) Date of Patent: Oct. 8, 2002

(54) HIGH-FREQUENCY AMPLIFIER AND HIGH-FREQUENCY MULTISTAGE AMPLIFIER

(75) Inventors: Kazutomi Mori, Tokyo (JP); Kazuhisa Yamauchi, Tokyo (JP); Koji Yamanaka, Tokyo (JP); Kazuhiko Nakahara, Tokyo (JP); Tadashi Takagi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/988,326

(22) Filed: Nov. 19, 2001

(30) Foreign Application Priority Data

May 29, 2001 (JP) ........................................ 2001-160958

(51) Int. Cl.$^7$ ................................................ H03F 3/04
(52) U.S. Cl. ...................... 330/302; 330/306; 333/81 R
(58) Field of Search .............................. 330/302, 306, 330/310, 311, 144; 333/172, 81 R, 32

(56) References Cited

U.S. PATENT DOCUMENTS

| | | | |
|---|---|---|---|
| 4,716,321 | * 12/1987 | Erratico | 307/540 |
| 5,162,755 | * 11/1992 | Mara, Jr. et al. | 330/277 |
| 5,726,606 | * 3/1998 | Marland | 330/302 |
| 5,977,834 | * 11/1999 | Davis et al. | 330/302 |
| 6,177,841 | * 1/2001 | Ohta et al. | 330/302 |

OTHER PUBLICATIONS

H. Yukawa et al.: "Ultra–Low Noise LNA With Series Drain Resisters" The Institute of Electronics, Information and Communication Engineers, Society Meeting of 1999, C–2–38, p. 67.

* cited by examiner

*Primary Examiner*—Benny Lee
*Assistant Examiner*—Henry Choe

(57) ABSTRACT

A T-type circuit having series resistors and a parallel resistor is arranged on the outside of an amplifier, a signal is amplified in the amplifier while stabilizing the signal by using the T-type circuit functioning as a stabilizing circuit, and the amplified signal is output. In this case, values of the series resistors and the parallel resistor of the T-type circuit are determined so as to set an output load impedance obtained by seeing the output side of the high-frequency amplifier from the amplifier to a value near to or slightly lower than a value of the conjugate complex impedance of an output impedance of the amplifier. Therefore, the output signal having a high output electric power and a low distortion can be obtained in the high-frequency amplifier while keeping a gain and a noise characteristic of the high-frequency amplifier.

9 Claims, 8 Drawing Sheets

HIGH-FREQUENCY AMPLIFIER AND HIGH-FREQUENCY MULTISTAGE AMPLIFIER

BACKGROUND OF THE INVENTION

1. Field of the Invention

The present invention relates to a high-frequency amplifier and a high-frequency multistage amplifier which are used for the satellite communication, the ground microwave communication and/or the mobile communication.

2. Description of Related Art

FIG. 16 is a view showing the configuration of a conventional high-frequency amplifier disclosed in a letter "Ultra-Low Noise LNA with Series Drain Resisters", the Institute of Electronics, Information and Communication Engineers, Society Meeting of 1999, C-2-38, pp. 67.

In FIG. 16, 1 indicates an input terminal for receiving an input signal. 2 indicates an output terminal. 3 indicates an amplifier for amplifying the input signal. 4 indicates an input matching circuit for applying an input-side bias to the input signal. 5 indicates an output matching circuit. 6 indicates a series resistor. 7 indicates an inductor or a line for a bias feed. 8 indicates a condenser. 9 indicates an output-side bias circuit for applying an output-side bias to the signal amplified in the amplifier 3. The output-side bias circuit 9 is composed of the inductor 7 and the condenser 8.

Next, an operation will be described below.

A signal input to the input terminal 1 is received in the amplifier 3 through the input matching circuit 4. Thereafter, the input signal is amplified in the amplifier 3 while stabilizing the amplified signal in the series resistor 6. Thereafter, the amplified signal is output from the output terminal 2 through the output matching circuit 5 as an output signal. An input-side bias is applied to the input signal in an input-side bias circuit arranged in the input matching circuit 4. An output-side bias is applied to the amplified signal from the output-side bias circuit 9. Therefore, the input signal can be amplified without an unstable operation such as oscillation. Also, because the series resistor 6 for stabilization is inserted into the conventional high-frequency amplifier on the output side of the amplifier 3, a low noise characteristic can be obtained in the conventional high-frequency amplifier.

However, because the series resistor 6 for stabilization is inserted on the output side of the amplifier 3, the loss of an electric power of the amplified signal is generated in the series resistor 6 placed on the output side of the amplifier 3, and an output electric power characteristic and a third intercept point (IP3) denoting a distortion characteristic deteriorate in the conventional high-frequency amplifier. The reason of the deterioration of the characteristics will be described.

In the example shown in FIG. 16, the series resistor 6 having a resistance value of Rs is serially inserted between the output side of the amplifier 3 and the output matching circuit 5, and an output impedance of the amplifier 3 is equal to a value Zout. In this case, an output impedance having a value of Zout+Rs is obtained when the amplifier 3 is seen from the output matching circuit 5, and the output impedance Zout+Rs is changed to a characteristic impedance Zo in the output matching circuit 5. Therefore, an impedance Zout*+Rs obtained by seeing the output side of the conventional high-frequency amplifier from a stabilizing circuit composed of the series resistor 6 is equal to a value conjugated to the complex number Zout+Rs of the output impedance, and an output load impedance ZL obtained by seeing the output side of the conventional high-frequency amplifier from the amplifier 3 is equal to a value Zout*+2Rs conjugated to a complex number Zout+2Rs. Accordingly, the output load impedance ZL is higher than a conjugate complex impedance Zout* of the output impedance Zout of the amplifier 3 by 2Rs.

Also, in general, an output electric power of the amplified signal output from the amplifier 3 and the third intercept point are set to highest values in cases where the output load impedance ZL obtained by seeing the output side of a high-frequency amplifier from the amplifier 3 is slightly lower than the conjugate complex impedance Zout* of the output impedance Zout of the amplifier 3.

Therefore, because the output load impedance ZL obtained by seeing the output side of the conventional high-frequency amplifier from the amplifier 3 is higher than the conjugate complex impedance of the output impedance Zout of the amplifier 3 by 2Rs in the conventional high-frequency amplifier, in addition to the electric power loss occurred in the series resistor 6 which is inserted on the output side of the amplifier 3, a problem has arisen that the output electric power of the amplified signal output from the amplifier 3 and the third intercept point are lowered.

SUMMARY OF THE INVENTION

An object of the present invention is to provide, with due consideration to the drawbacks of the conventional high-frequency amplifier, a high-frequency amplifier and a high-frequency multistage amplifier in which an output signal having a high output electric power and a low distortion is obtained.

The object is achieved by the provision of a high-frequency amplifier comprising an amplifier for amplifying an input signal, and a stabilizing circuit, which is arranged on an output side of the amplifier and has a series resistor and a parallel resistor, for stabilizing the amplification of the input signal performed in the amplifier and outputting the amplified input signal.

In the above configuration, in cases where values of the series resistor and the parallel resistor are determined so as to set an output load impedance obtained by seeing the output side of the high-frequency amplifier from the amplifier to a value near to or slightly lower than a value of a conjugate complex impedance of an output impedance of the amplifier, an output signal having a high output electric power and a low distortion can be obtained in the high-frequency amplifier while keeping a gain and a noise characteristic of the high-frequency amplifier.

It is preferred that the stabilizing circuit is formed of a T-type circuit having a first series resistor, a second series resistor and the parallel resistor.

In this case, the gain of the high-frequency amplifier can be adjusted by adjusting the value of the first series resistor.

It is also preferred that the stabilizing circuit is formed of a π-type circuit having the series resistor, a first parallel resistor and a second parallel resistor.

In this case, the gain of the high-frequency amplifier can be adjusted by adjusting the value of the second parallel resistor.

It is also preferred that the stabilizing circuit is formed of a ladder-type circuit having the series resistor and the parallel resistor.

In this case, because the number of resistors in the ladder-type circuit is lower than that in the, T-type circuit or the π-type circuit, the configuration of the high-frequency amplifier can be simplified.

It is also preferred that the high-frequency amplifier further comprises a series inductor arranged between the amplifier and the stabilizing circuit, and a parallel condenser arranged between the amplifier and the stabilizing circuit.

Therefore, an output signal having a lower distortion can be obtained in the high-frequency amplifier.

The object is also achieved by the provision of a high-frequency multistage amplifier comprising a specific high-frequency amplifier, arranged in a first stage, for amplifying an input signal, and a general high-frequency amplifier, arranged in a stage following the first stage, for amplifying the input signal amplified by the specific high-frequency amplifier and outputting the amplified input signal as an output signal. The specific high frequency amplifier comprises an amplifier for amplifying the input signal, and a stabilizing circuit, which is arranged on an output side of the amplifier and has a series resistor and a parallel resistor, for stabilizing the amplification of the input signal performed in the amplifier.

In the above configuration, in cases where values of the series resistor and the parallel resistor of the stabilizing circuit are determined so as to set an output load impedance obtained by seeing the output side of the specific high-frequency amplifier from the amplifier to a value near to or slightly lower than a value of a conjugate complex impedance of an output impedance of the-amplifier, an output signal having a high output electric power and a low distortion can be obtained in the specific high-frequency amplifier while keeping a gain and a noise characteristic of the high-frequency amplifier. Therefore, an output signal having a high output electric power and a low distortion can be obtained in the whole high-frequency multistage amplifier while keeping a gain and a noise characteristic of the high-frequency amplifier.

Also, because the specific high-frequency amplifier arranged in the first stage of the high-frequency multistage amplifier has a high influence on the noise generated in the signal, the noise of the signal output from the high-frequency multistage amplifier can be efficiently lowered.

It is preferred that the stabilizing circuit of the specific high-frequency amplifier is formed of a T-type circuit having a first series resistor, a second series resistor and the parallel resistor.

In this case, the gain of the high-frequency amplifier can be adjusted by adjusting the value of the first series resistor.

It is also preferred that the stabilizing circuit of the specific high-frequency amplifier is formed of a π-type circuit having the series resistor, a first parallel resistor and a second parallel resistor.

In this case, the gain of the high-frequency amplifier can be adjusted by adjusting the value of the second parallel resistor.

It is also preferred that the stabilizing circuit of the specific high-frequency amplifier is formed of a ladder-type circuit having the series resistor and the parallel resistor.

In this case, because the number of resistors in the ladder-type circuit is lower than that in the T-type circuit or the π-type circuit, the configuration of the high-frequency amplifier can be simplified.

DETAILED DESCRIPTION OF THE PREFERRED EMBODIMENTS

Embodiments of the present invention will now be described with reference to the accompanying drawings.

Embodiment 1

Figure 1:
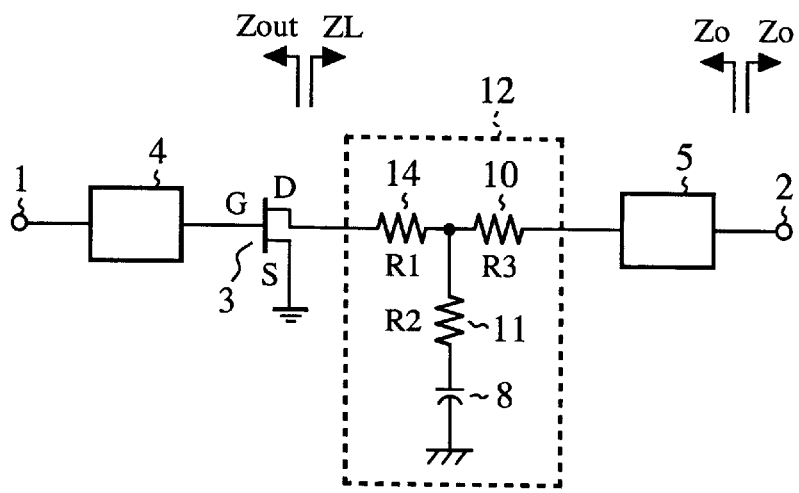
FIG. 1 is a view showing the configuration of a high-frequency amplifier according to a first embodiment of the present invention.

FIG. 1 is a view showing the configuration of a high-frequency amplifier according to a first embodiment of the present invention.

In FIG. 1, 1 indicates an input terminal for receiving an input signal. 2 indicates an output terminal for outputting an output signal. 3 indicates an amplifier for amplifying the input signal. 4 indicates an input matching circuit for applying an input-side bias to the input signal. 5 indicates an output matching circuit. 14 indicates a series resistor (or a first series resistor) serially arranged between the amplifier 3 and the output matching circuit 5. 10 indicates a series resistor (or a second series resistor) serially connected to the series resistor 14 between the amplifier 3 and the output matching circuit 5. 11 indicates a parallel resistor connected to a connection point of the series resistors 14 and 10. The parallel resistor 11 is arranged to be parallel to the series resistors 14 and 10. 8 is a condenser. One end of the condenser 8 is connected to the parallel resistor 11, and the other end of the condenser 8 is grounded. 12 indicates a T-type circuit functioning as a stabilizing circuit. The T-type circuit 12 is composed of the series resistors 14 and 10, the parallel resistor 11 and the condenser 8. The series resistor 14 has a resistance value R1, the parallel resistor 11 has a resistance value R2, and the series resistor 10 has a resistance value R3.

Next, an operation of the high-frequency amplifier will be described below.

A signal input to the input terminal 1 is received in the amplifier 3 through the input matching circuit 4. Thereafter, the input signal is amplified in the amplifier 3 while stabilizing the amplified signal by using the T-type circuit 12 having the series resistors 14 and 10 and the parallel resistor 11. Thereafter, the amplified signal is output as an output signal from the output terminal 2 through the output matching circuit 5. In this case, an input-side bias is applied to the input signal in an input-side bias circuit arranged in the input matching circuit 4, and an output-side bias is applied to the amplified signal through the parallel resistor 11 of the T-type circuit 12 functioning as a stabilizing circuit. Here, it is applicable that the output-side bias be applied to the amplified signal in an inductor or a line for bias feed arranged between the T-type circuit 12 and the amplifier 3. Also, it is applicable that the output-side bias be applied to the amplified signal in a bias circuit arranged in the output matching circuit 5.

Because the T-type circuit 12 functioning as a stabilizing circuit is arranged in the high-frequency amplifier, the input signal can be amplified without an unstable operation such as oscillation. Also, because the T-type circuit 12 having the series resistors 14 and 10 and the parallel resistor 11 is inserted into the high-frequency amplifier on the output side of the amplifier 3, a low noise characteristic can be obtained in the high-frequency amplifier.

Here, the condenser 8 is arranged to cut a direct current. However, it is applicable that a condenser be arranged between the series resistor 14 and the amplifier 3 to cut a direct current in place of the condenser 8. Also, it is applicable that a condenser be arranged between the connection point of the series resistors 14 and 10 and the parallel resistor 11 to cut a direct current in place of the condenser 8. Also, in cases where the resistance value R2 of the parallel resistor 11 is sufficiently high so as to sufficiently lower a current flowing the parallel resistor 11, the increase of an electric power consumed in the parallel resistor 11 can be disregarded. Therefore, in this case, the condenser 8 is not required.

In the configuration shown in FIG. 1, because the T-type circuit 12 having the series resistors 14 and 10 and the parallel resistor 11 functions as a stabilizing circuit, even though an output impedance obtained by seeing the amplifier 3 and the T-type circuit 12 from the output matching circuit 5 is matched to a characteristic impedance Zo in the output matching circuit 5, an output load impedance ZL obtained by seeing the output side of the high-frequency amplifier from the amplifier 3 can be appropriately set to a value higher or lower than or equal to a value of an impedance Zout* conjugated to the complex number of the output impedance Zout of the amplifier 3. In this case, only the output load impedance ZL obtained by seeing the output side of the high-frequency amplifier from the amplifier 3 can be changed on condition that a gain of the high-frequency amplifier, or an electric power loss on the output side of the amplifier 3, is maintained to a constant value.

In cases where only the output load impedance ZL obtained by seeing the output side of the high-frequency amplifier from the amplifier 3 is changed on condition that a gain of the high-frequency amplifier, or an electric power loss on the output side of the amplifier 3, is maintained to a constant value, an output electric power (P1dB) in a gain compression of 1 dB, a third input intercept point (IIP3), a third output intercept point (OIP3), a third inter-modulation distortion (IM3) and a fifth inter-modulation distortion (IM5) are calculated. In the calculation of IM3 and IM5, an input electric power is set to a certain value.

The calculation is performed at a frequency of 900 MHz by using a large signal model of a field effect transistor (FET) having a gate width of 5.8 mm as the amplifier 3. In this calculation, the input matching circuit 4 is arranged on the input side of the high-frequency amplifier, but the output matching circuit 5 is not arranged on the output side of the high-frequency amplifier. Therefore, the T-type circuit 12 having the resistors is arranged on the output side of the high-frequency amplifier and is directly connected to a load element of the characteristic impedance Zo. A gain of the high-frequency amplifier is set to be almost equal to 11 dB, the values R1, R3 and R2 of the series resistors 14 and 10 and the parallel resistor 11 are determined so as to set the output load impedance ZL obtained by seeing the output side of the high-frequency amplifier from the FET (that is, the amplifier 3) to each of values ranging from 8 to 100 Ω. A bias condition is set to the Class-AB, and the output impedance zout of the FET in the setting bias condition is set to 11.1−j3.3 Ω. Here, the symbol j expresses an imaginary part.

Figure 2:
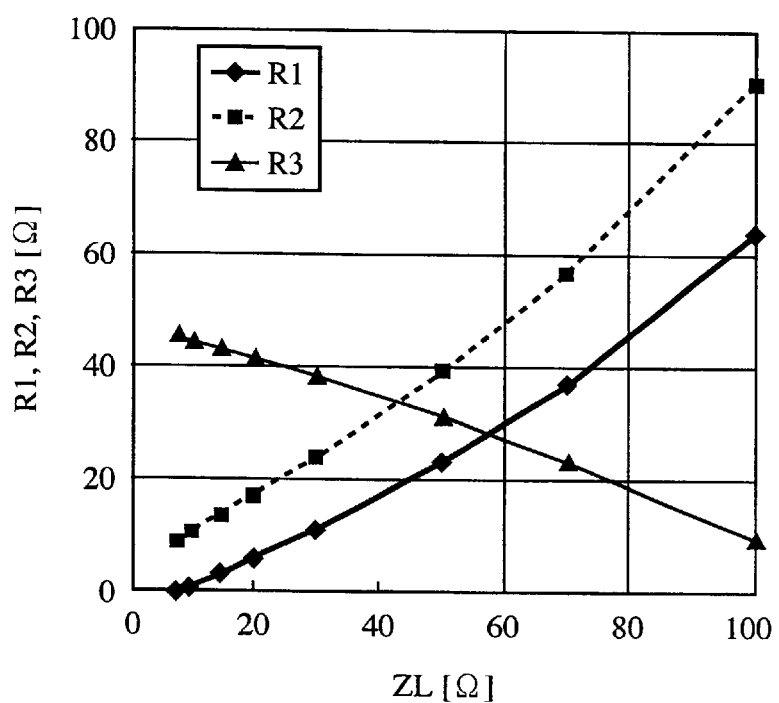
FIG. 2 shows a characteristic view of resistance values of series resistors and a parallel resistor in cases where an output load impedance obtained by seeing an output side of the high-frequency amplifier from an FET ranges from 8 to 100 Ω.

FIG. 2 shows a characteristic view of the values R1, R3 and R2 of the series resistors 14 and 10 and the parallel resistor 11 in cases where the output load impedance ZL obtained by seeing the output side from the FET is set to each of values ranging from 8 to 100 Ω. Also, FIG. 3 shows a characteristic view of both a maximum available electric power gain MAG and a stabilizing factor K in cases where the output load impedance ZL is set in the range from 8 to 100 Ω.

Figure 3:
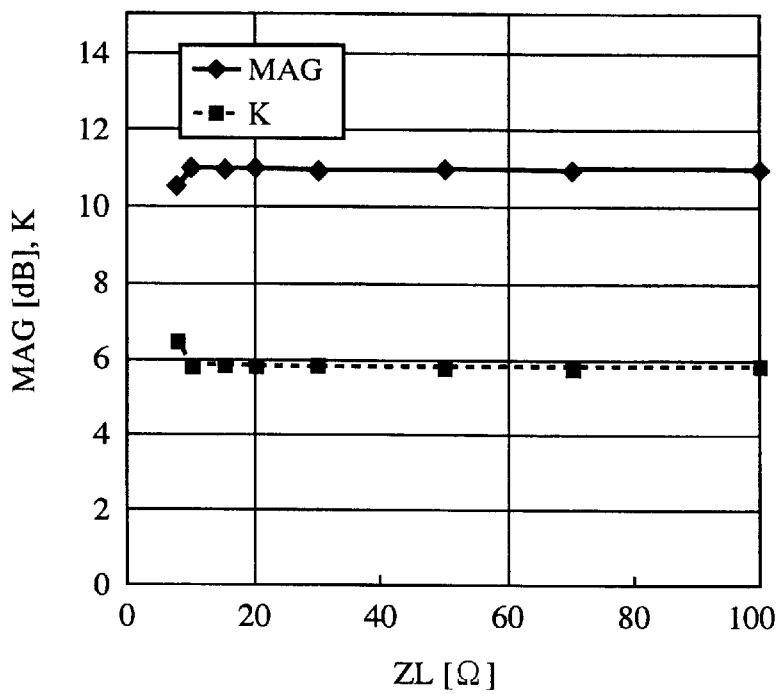
FIG. 3 shows a characteristic view of both a maximum available electric power gain MAG and a stabilizing factor K with respect to the output load impedance.

As shown in FIG. 3, in cases where the series resistors 14 and 10 and the parallel resistor 11 are set to the resistance values R1, R3 and R2 shown in FIG. 2, the output load impedance ZL can be changed in the range from 8 to 100 Ω without changing the maximum available electric power gain MAG denoting a gain of the high-frequency amplifier or the stabilizing factor K.

Figure 4:
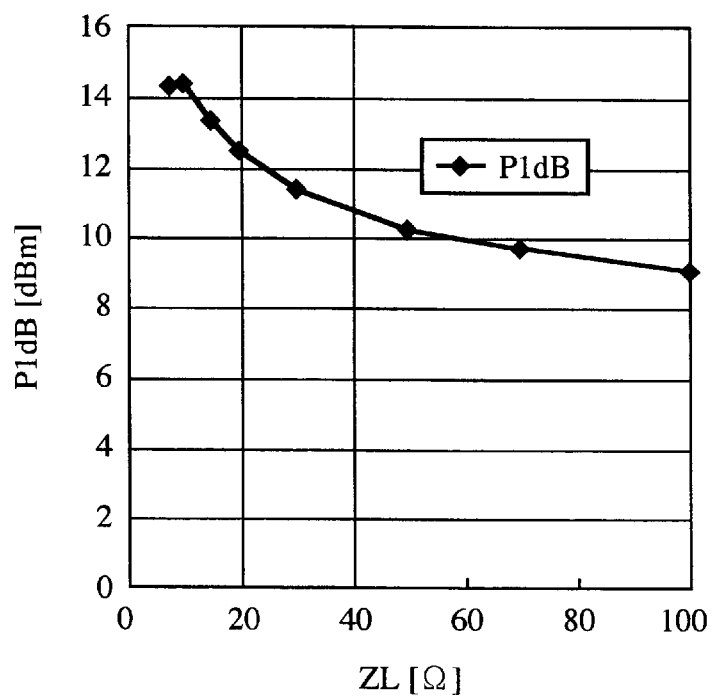
FIG. 4 shows a characteristic view of an output electric power (P1dB) with respect to the output load impedance.
Figure 5:
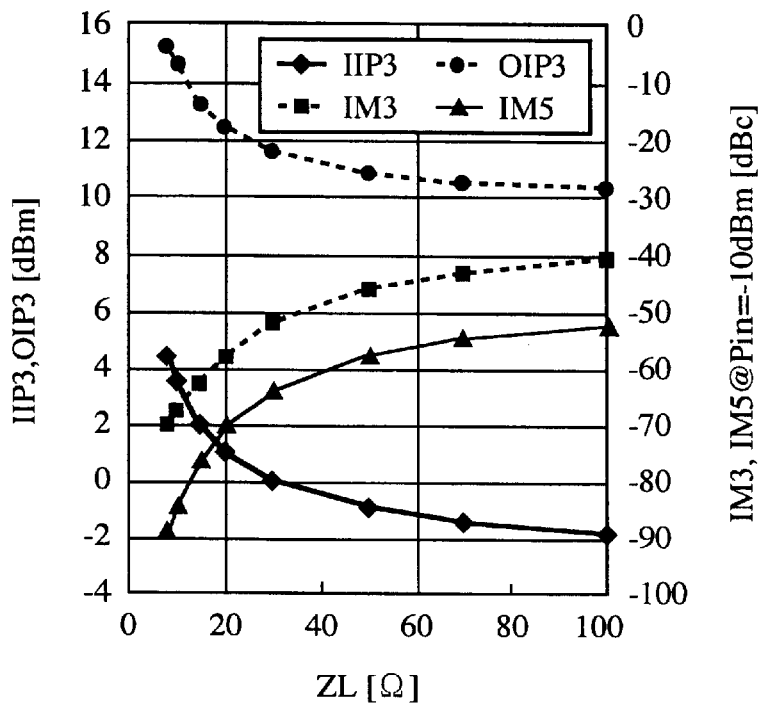
FIG. 5 shows a characteristic view of a third input intercept point (IIP3), a third output intercept point (OIP3), a third inter-modulation distortion (IM3) and a fifth inter-modulation distortion (IM5) with respect to the output load impedance on condition that an input electric power is set to −10 dBm.

Also, FIG. 4 shows a characteristic view of the output electric power (P1dB) in cases where the output load impedance ZL is set in the range from 8 to 100 106 , and FIG. 5 shows a characteristic view of the third input intercept point (IIP3), the third output intercept point (OIP3), the third inter-modulation distortion (IM3) and the fifth inter-modulation distortion (IM5) in cases where the output load impedance ZL is set in the range from 8 to 100 Ω. In the calculation of IM3 and IM5, an input electric power is set to −10 dBm.

As shown in FIG. 4, when the output load impedance ZL is changed in the range from 8 to 100 106 , the output electric power (P1dB) is changed by about 5 dB. Also, as shown in FIG. 5, when the output load impedance ZL is changed in the range from 8 to 100 106 , the third input intercept point (IIP3) is changed by about 5 dB, the third output intercept point (OIP3) is changed by about 4.5 dB, the third inter-modulation -distortion (IM3) is changed by about 25 dB, and the fifth inter-modulation distortion (IM5) is changed by about 30 dB.

Figure 16:
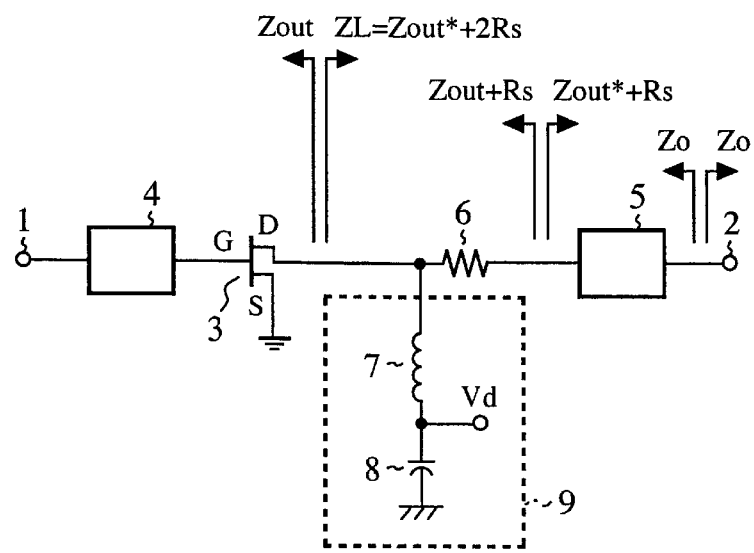
FIG. 16 is a view showing the configuration of a conventional high-frequency amplifier.

In contrast, in cases where the calculation of the output electric power (P1dB), the third input intercept point (IIP3), the third output intercept point (OIP3), the third inter-modulation distortion (IM3) and the fifth inter-modulation distortion (IM5) is performed for the conventional high-frequency amplifier shown in FIG. 16, the resistance value Rs of the series resistor 14 denoting a stabilizing circuit is equal to about 70 Ω, and the output impedance zout of the amplifier 3 is equal to about 11 Ω. Therefore, because the output load impedance ZL=Zout*+2Rs is satisfied, the value of the output load impedance ZL is equal to about 150 Ω. That is, the output load impedance ZL is considerably higher than the conjugate complex impedance Zout* of the output impedance Zout in the prior art.

Therefore, as shown in FIG. 1, because the T-type circuit 12 having the series resistors 14 and 10 and the parallel resistor 11 is used as a stabilizing circuit in the first embodiment, in cases where the values R1, R3 and R2 of the series resistors 14 and 10 and the parallel resistor 11 are determined so as to set the output load impedance ZL obtained by seeing the output side of the high-frequency amplifier from the amplifier 3 to a value near to or slightly lower than a value of the conjugate complex impedance Zout* of the output impedance Zout (Zout=11.1–j3.3 Ω), the output signal having a high output electric power and a low distortion can be obtained in the high-frequency amplifier, as compared with that in the conventional high-frequency amplifier, while keeping a gain of the high-frequency amplifier and a noise characteristic to constant values. Here, the gain of the high-frequency amplifier can be adjusted by adjusting the resistance value R1 of the series resistor 14.

The calculation results shown in FIG. 2 to FIG. 5 are obtained on condition that the matching to the characteristic impedance Zo equal to 50 Ω is simultaneously performed by using the stabilizing circuit (that is, the T-type circuit 12) placed on the output side of the high-frequency amplifier. However, the matching performed by using the stabilizing circuit is limited up to an appropriate impedance.

Also, even though the output matching circuit 5 is arranged on the output side of the high-frequency amplifier as shown in FIG. 1, the output signal having a high output electric power and a low distortion can be obtained in the high-frequency amplifier.

Embodiment 2

Figure 6:
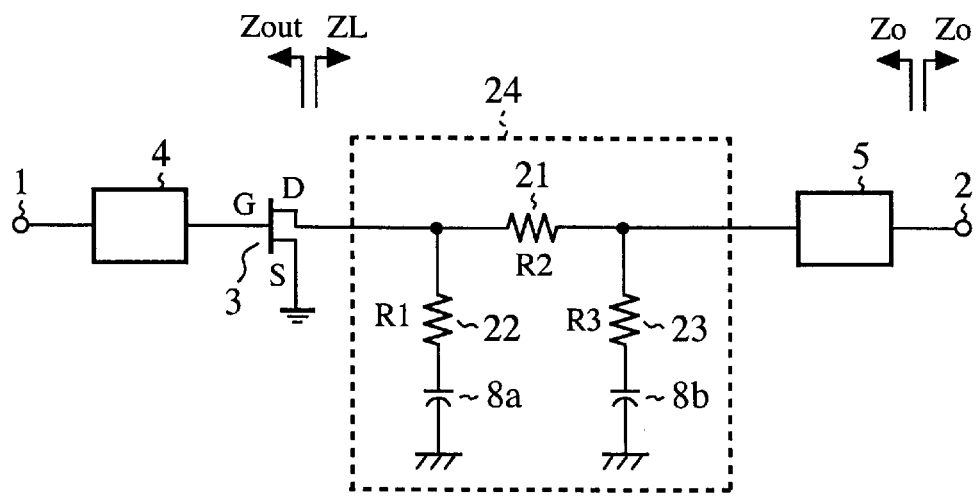
FIG. 6 is a view showing the configuration of a high-frequency amplifier according to a second embodiment of the present invention.

FIG. 6 is a view showing the configuration of a high-frequency amplifier according to a second embodiment of the present invention. The constituent elements, which are the same as those shown in FIG. 1, are indicated by the same reference numerals as those of the constituent elements shown in FIG. 1, and additional description of those constituent elements is omitted.

In FIG. 6, 21 indicates a series resistor serially arranged between the amplifier 3 and the output matching circuit 5. 22 indicates a parallel-resistor (or a first parallel resistor) placed on the input side of the series resistor 21 so as to be arranged in parallel to the series resistor 21. 23 indicates a parallel resistor (or a second parallel resistor) placed on the output side of the series resistor 21 so as to be arranged in parallel to the series resistor 21. 8a indicates a condenser. One end of the condenser 8a is connected to the parallel resistor 22, and the other end of the condenser 8a is grounded. 8b indicates a condenser. One end of the condenser 8b is connected to the parallel resistor 23, and the other end of the condenser 8b is grounded. 24 indicates a π-type circuit functioning as a stabilizing circuit. The π-type circuit 24 is composed of the series resistor 21, the parallel resistors 22 and 23 and the condensers 8a and 8b. The parallel resistor 22 has a resistance value R1, the series resistor 21 has a resistance value R2, and the parallel resistor 23 has a resistance value R3.

Next, an operation of the high-frequency amplifier will be described below.

A signal input to the input terminal 1 is received in the amplifier 3 through the input matching circuit 4. Thereafter, the input signal is amplified in the amplifier 3 while stabilizing the amplified input signal by using the π-type circuit 24 having the series resistor 21 and the parallel resistors 22 and 23. Thereafter, the amplified signal is output as an output signal from the output terminal 2 through the output matching circuit 5. In this case, an input-side bias is applied to the input signal in an input-side bias circuit arranged in the input matching circuit 4, and an output-side bias is applied to the amplified signal through the parallel resistors 22 and 23 of the π-type circuit 24 functioning as a stabilizing circuit.

Here, it is applicable that the output-side bias be applied to the amplified signal in an inductor or a line for bias feed arranged between the π-type circuit 24 and the amplifier 3. Also, it is applicable that the output-side bias be applied to the amplified signal in a bias circuit arranged in the output matching circuit 5.

Because the π-type circuit 24 functioning as a stabilizing circuit is arranged in the high-frequency amplifier, the input signal can be amplified without an unstable operation such as oscillation. Also, because the π-type circuit 24 having the series resistor 21 and the parallel resistors 22 and 23 is inserted into the high-frequency amplifier on the output side of the amplifier 3, a low noise characteristic can be obtained in the high-frequency amplifier.

Here, the condensers 8a and 8b are arranged to cut direct currents. However, it is applicable that a condenser be arranged between the series resistor 21 and the amplifier 3 in place of the condensers 8a and 8b to cut a direct current. Also, it is applicable that a condenser be arranged between the series resistor 21 and the parallel resistor 22 to cut a direct current. In this case, the condenser 8b arranged between the parallel resistor 23 placed further from the amplifier 3 and the ground is not required.

Also, in cases where the resistance values R1 and R3 of the parallel resistors 22 and 23 are sufficiently high so as to sufficiently lower a current flowing each of the parallel resistors 22 and 23, the increase of an electric power consumed in the parallel resistors 22 and 23 can be disregarded. Therefore, in this case, the group of the condensers 8a and 8b is not required.

In the configuration shown in FIG. 6, because the π-type circuit 24 having the series resistor 21 and the parallel resistors 22 and 23 functions as a stabilizing circuit, even though an output impedance obtained by seeing the amplifier 3 and the π-type circuit 24 from the output matching circuit 5 is matched to a characteristic impedance Zo in the output matching circuit 5, an output load impedance ZL obtained by seeing the output side of the high-frequency amplifier from the amplifier 3 can be appropriately set to a value higher or lower than or equal to a value of an impedance Zout* conjugated to the complex number of the output impedance Zout of the amplifier 3. In this case, only the output load impedance ZL obtained by seeing the output side of the high-frequency amplifier from the amplifier 3 can be changed on condition that a gain of the high-frequency amplifier, or an electric power loss on the output side of the amplifier 3, is maintained to a constant value.

In cases where only the output load impedance ZL obtained by seeing the output side of the high-frequency amplifier from the amplifier 3 is changed on condition that a gain of the high-frequency amplifier, or an electric power loss on the output side of the amplifier 3, is maintained to a constant value, an output electric power (P1dB) in a gain compression of 1 dB, a third input intercept point (IIP3), a third output intercept point (OIP3), a third inter-modulation distortion (IM3) and a fifth inter-modulation distortion (IM5) are calculated. In the calculation of IM3 and IM5, an input electric power is set to a certain value.

The calculation is performed at a frequency of 900 MHz by using a large signal model of a field effect transistor (FET) having a gate width of 5.8 mm as the amplifier 3. In this calculation, the input matching circuit 4 is arranged on the input side of the high-frequency amplifier, but the output matching circuit 5 is not arranged on the output side of the high-frequency amplifier. Therefore, the π-type circuit 24 having the resistors is arranged on the output side of the high-frequency amplifier and is directly connected to a load element of the characteristic impedance Zo. A gain of the high-frequency amplifier is set to be almost equal to 11 dB, the values R2, R1 and R3 of the series resistor 21 and the parallel resistors 22 and 23 are determined so as to set the output load impedance ZL obtained by seeing the output side of the high-frequency amplifier from the FET (that is, the amplifier 3) to each of values ranging from 8 to 100 106 . A bias condition is set to the Class-AB, and the output impedance Zout of the FET in the setting bias condition is set to 11.1–j3.3 Ω.

Figure 7:
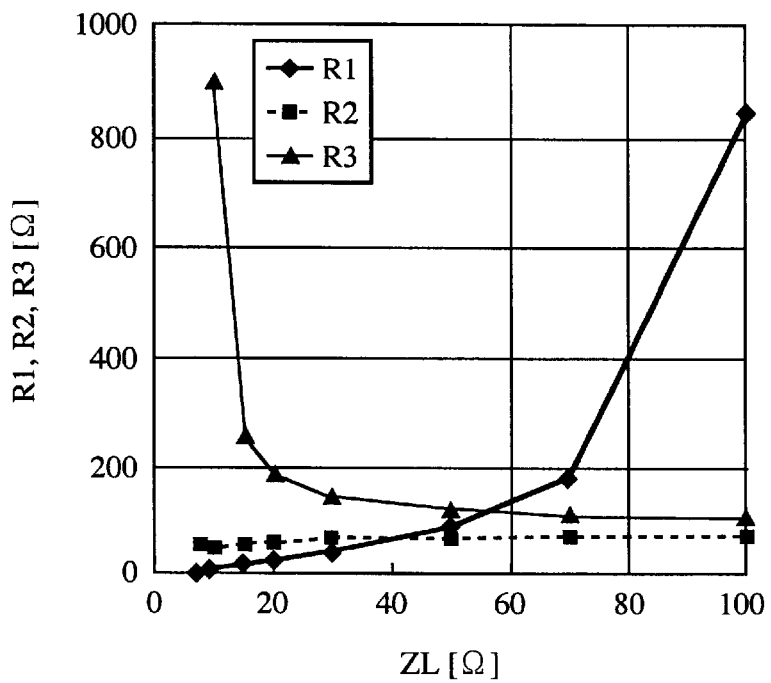
FIG. 7 shows a characteristic view of resistance values of a series resistor and two parallel resistors in cases where an output load impedance obtained by seeing an output side of the high-frequency amplifier from an FET ranges from 8 to 100 Ω.

FIG. 7 shows a characteristic view of the values R2, R1 and R3 of the series resistor 21 and the parallel resistors 22 and 23 in cases where the output load impedance ZL obtained by seeing the output side from the FET is set to each of values ranging from 8 to 100 106 . Also, FIG. 8 shows a characteristic view of both a maximum available electric power gain MAG and a stabilizing factor K in cases where the output load impedance ZL is set in the range from 8 to 100 106 .

Figure 8:
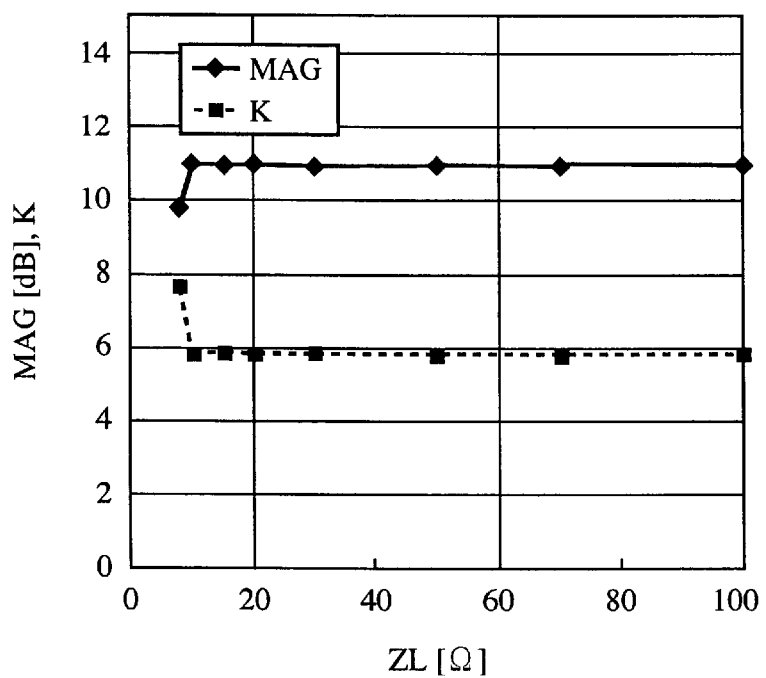
FIG. 8 shows a characteristic view of both a maximum available electric power gain MAG and a stabilizing factor K with respect to the output load impedance.

As shown in FIG. 8, in cases where the series resistor 21 and the parallel resistors 22 and 23 are set to the resistance values R2, R1 and R3 shown in FIG. 7, the output load impedance ZL can be changed in the range from 8 to 100 Ω without changing the maximum available electric power gain MAG denoting a gain of the high-frequency amplifier or the stabilizing factor K.

Figure 9:
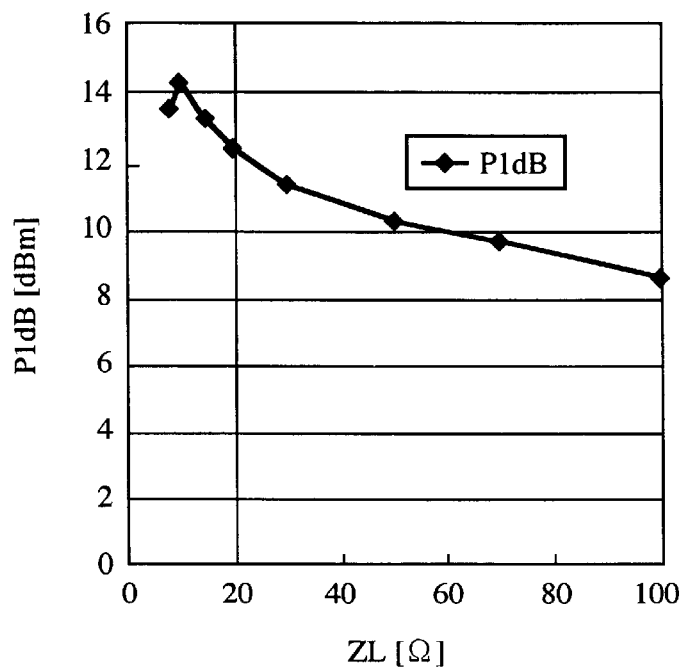
FIG. 9 shows a characteristic view of an output electric power (P1dB) with respect to the output load impedance.
Figure 10:
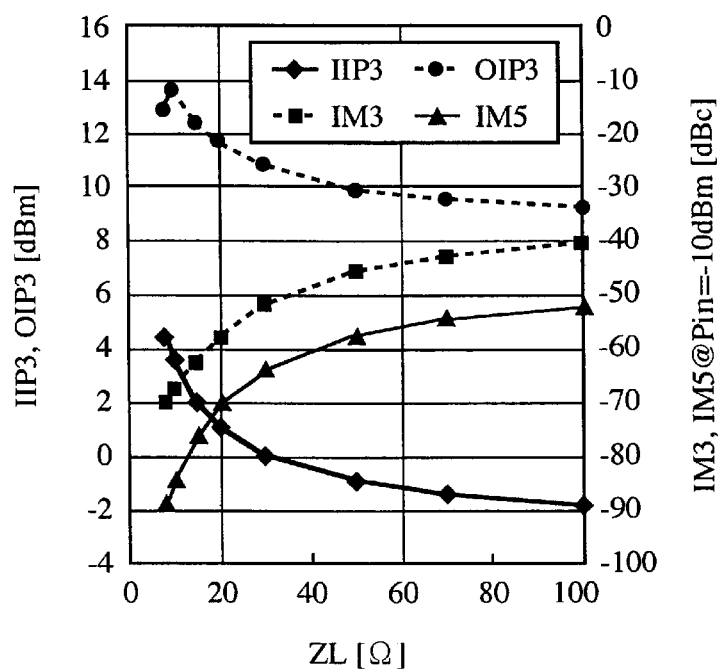
FIG. 10 shows a characteristic view of a third input intercept point (IIP3), a third output intercept point (OIP3), a third inter-modulation distortion (IM3) and a fifth inter-modulation distortion (IM5) with respect to the output load impedance on condition that an input electric power is set to −10 dBm.

Also, FIG. 9 shows a characteristic view of the output electric power (P1dB) in cases where the output load impedance ZL is set in the range from 8 to 100 106 and FIG. 10 shows a characteristic view of the third input intercept point (IIP3), the third output intercept point (OIP3), the third inter-modulation distortion (IM3) and the fifth inter-modulation distortion (IM5) in cases where the output load impedance ZL is set in the range from 8 to 100 Ω. In the calculation of IM3 and IM5, an input electric power is set to −10 dBm.

As shown in FIG. 9, when the output load impedance ZL is changed in the range from 8 to 100 106 , the output electric power (P1dB) is changed by about 5 dB . Also, as shown in FIG. 10, when the output load impedance ZL is changed in the range from 8 to 100 106 , the third input intercept point (IIP3) is changed by about 5 dB, the third output intercept point (OIP3) is changed by about 4.5 dB, the third inter-modulation distortion (IM3) is changed by about 25 dB, and the fifth inter-modulation distortion (IMS) is changed by about 30 dB.

In contrast, in cases where the calculation of the output electric power (P1dB), the third input intercept point (IIP3), the third output intercept point (OIP3) the third inter-modulation distortion (IM3) and the fifth inter-modulation distortion (IM5) is performed for the conventional high-frequency amplifier shown in FIG. 16, the resistance value Rs of the series resistor 6 denoting a stabilizing circuit is equal to about 70 Ω and the output impedance zout of the amplifier 3 is equal to about 11 Ω. Therefore, because the output load impedance ZL=Zout*+2Rs is satisfied, the value of the output load impedance ZL is equal to about 150 Ω. That is, the output load impedance ZL is considerably higher than the conjugate complex impedance Zout* of the output impedance Zout in the prior art.

Therefore, as shown in FIG. 6, because the π-type circuit 24 having the series resistor 21 and the parallel resistors 22 and 23 is used as a stabilizing circuit in the second embodiment, in cases where the values R2, R1 and R3 of the series resistor 21 and the parallel resistors 22 and 23 are determined so as to set the output load impedance ZL obtained by seeing the output side of the high-frequency amplifier from the amplifier 3 to a value near to or slightly lower than a value of the conjugate complex impedance Zout* of the output impedance Zout (Zout=11.1−j3.3 Ω), the output signal having a high output electric power and a low distortion can be obtained in the high-frequency amplifier, as compared with that in the conventional high-frequency amplifier, while keeping a gain of the high-frequency amplifier and a noise characteristic to constant values. Here, the gain of the high-frequency amplifier can be adjusted by adjusting the resistance value R3 of the parallel resistor 23.

The calculation results shown in FIG. 7 to FIG. 10 are obtained on condition that the matching to the characteristic impedance Zo equal to 50 Ω is simultaneously performed by using the stabilizing circuit (that is, the π-type circuit 24) placed on the output side of the high-frequency amplifier. However, the matching performed by using the stabilizing circuit is limited up to an appropriate impedance.

Also, even though the output matching circuit 5 is arranged on the output side of the high-frequency amplifier as shown in FIG. 6, the output signal having a high output electric power and a low distortion can be obtained in the high-frequency amplifier.

Embodiment 3

Figure 11:
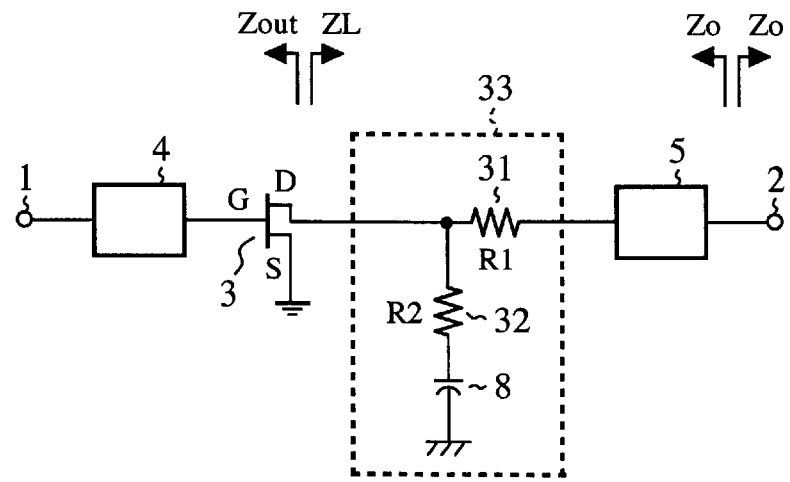
FIG. 11 is a view showing the configuration of a high-frequency amplifier according to a third embodiment of the present invention.

FIG. 11 is a view showing the configuration of a high-frequency amplifier according to a third embodiment of the present invention. The constituent elements, which are the same as those shown in FIG. 1, are indicated by the same reference numerals as those of the constituent elements shown in FIG. 1, and additional description of those constituent elements is omitted.

In FIG. 11, 31 indicates a series resistor serially arranged between the amplifier 3 and the output matching circuit 5. 32 indicates a parallel resistor placed on the input side of the series resistor 31 so as to be arranged in parallel to the series resistor 31. 33 indicates a ladder-type circuit functioning as a stabilizing circuit. The ladder-type circuit 33 is composed of the series resistor 31, the parallel resistor 32 and the condenser 8. The series resistor 31 has a resistance value R1, and the parallel resistor 32 has a resistance value R2.

Next, an operation of the high-frequency amplifier will be described below.

A signal input to the input terminal 1 is received in the amplifier 3 through the input matching circuit 4. Thereafter, the input signal is amplified in the amplifier 3 while stabilizing the amplified input signal by using the ladder-type circuit 33 having the series resistor 31 and the parallel resistor 32. Thereafter, the amplified signal is amplified in the amplifier 3 and is output as an output signal from the output terminal 2 through the output matching circuit 5. In this case, an input-side bias is applied to the input signal in an input-side bias circuit arranged in the input matching circuit 4, and an output-side bias is applied to the amplified signal through the parallel resistor 32 of the ladder-type circuit 33 functioning as a stabilizing circuit.

Here, it is applicable that the output-side bias be applied to the amplified signal in an inductor or a line for bias feed arranged between the ladder-type circuit 33 and the amplifier 3, and it is applicable that the output-side bias be applied to the amplified signal in a bias circuit arranged in the output matching circuit 5.

Because the ladder-type circuit 33 functioning as a stabilizing circuit is arranged in the high-frequency amplifier, the input signal can be amplified without an unstable operation such as oscillation. Also, because the ladder-type circuit 33 having the series resistor 31 and the parallel resistor 32 is inserted into the high-frequency amplifier on the output side of the amplifier 3, a low noise characteristic can be obtained in the high-frequency amplifier.

Here, the condenser 8 is arranged to cut a direct current. However, it is applicable that a condenser be arranged between the series resistor 32 and the amplifier 3 in place of the condenser 8 to cut a direct current. Also, in cases where the resistance value R2 of the parallel resistor 32 is sufficiently high so as to sufficiently lower a current flowing the parallel resistor 32, the increase of an electric power consumed in the parallel resistor 32 can be disregarded. Therefore, in this case, the condenser 8 is not required.

In the configuration shown in FIG. 11, the ladder-type circuit 33 having the series resistor 31 and the parallel resistor 32 functions as a stabilizing circuit. Therefore, in cases where an output impedance obtained by seeing the amplifier 3 and the ladder-type circuit 33 from the output matching circuit 5 is matched to a characteristic impedance Zo in the output matching circuit 5, because the parallel resistor 32 is placed on the side of the amplifier 3, an output load impedance ZL obtained by seeing the output side of the high-frequency amplifier from the amplifier 3 is lower than an impedance Zout* conjugated to the complex number of the output impedance Zout of the amplifier 3. In this case, a gain of the high-frequency amplifier, a stabilizing factor and the output load impedance ZL obtained by seeing the output side of the high-frequency amplifier from the amplifier 3 can be changed in a certain range by appropriately setting the resistance values R1 and R2 of the series resistor 31 and the parallel resistor 32.

An output electric power (P1dB) in a gain compression of 1 dB is calculated on condition that only the output load impedance ZL obtained by seeing the output side of the high-frequency amplifier from the amplifier 3 is changed. The calculation is performed at a frequency of 900 MHz by using a large signal model of a field effect transistor (FET) having a gate width of 5.8 mm as the amplifier 3. In this calculation, the input matching circuit 4 is arranged on the input side of the amplifier 3 to perform the input matching for the input signal, and the input signal is stabilized by using the ladder-type circuit 33 functioning as a stabilizing circuit. The output impedance Zout of the FET in the setting bias condition is set to 11.1−j3.3 Ω.

Figure 12:
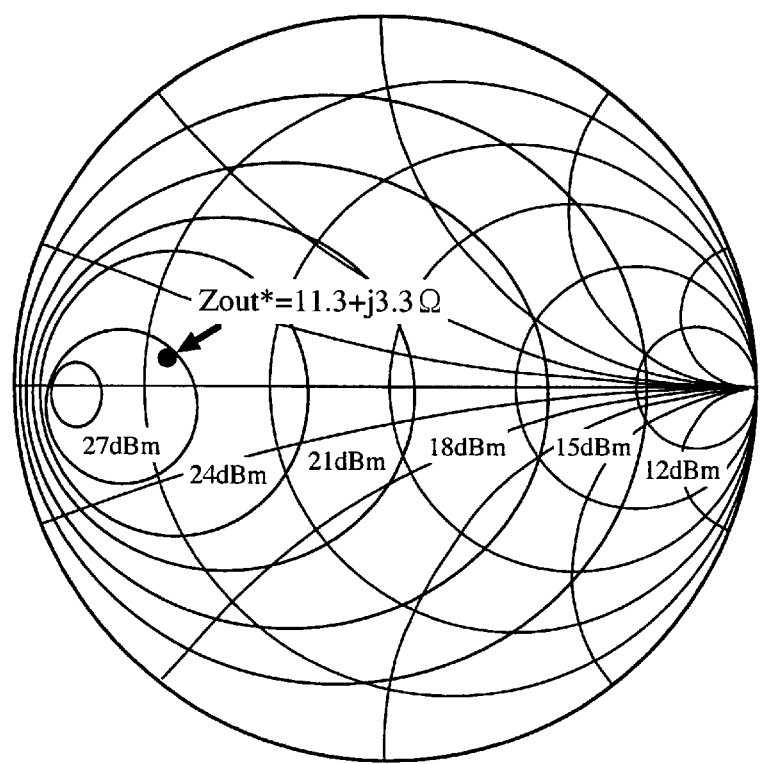
FIG. 12 shows a relation between an output electric power (P1dB) and an output load impedance obtained by seeing the output side of the high-frequency amplifier from an FET.

FIG. 12 shows a relation between the output electric power (P1dB) and the output load impedance ZL obtained by seeing the output side of the high-frequency amplifier from the FET denoting the amplifier 3. As shown in FIG. 12, the output electric power (P1dB) is maximized at an impedance value lower than the value 11.1−j3.3 Ω of the output impedance Zout of the FET. This relation between the output electric power (P1dB) and the output load impedance ZL coincides with both the relation (refer to FIG. 4 and FIG. 9) between the output electric power (P1dB) and the output load impedance ZL and the relation (refer to FIG. 5 and FIG. 10) between the third input intercept point (IIP3) and the output-load impedance ZL obtained in the high-frequency amplifiers shown in FIG. 1 and FIG. 6. That is, the output electric power (P1dB), and the third input intercept point (IIP3) are heightened because of the T-type circuit 12 or the π-type circuit 24 when the output load impedance ZL is lowered.

Accordingly, in the high-frequency amplifier shown in FIG. 11, because the output load impedance ZL obtained by seeing the output side of the high-frequency amplifier from the amplifier 3 can be set to a value lower than that of the output impedance Zout of the amplifier 3, the output signal having a high output electric power and a low distortion can be obtained in the high-frequency amplifier.

Also, because the number of resistors placed on the outside of the amplifier 3 is low by one as compared with that in the high-frequency amplifiers shown in FIG. 1 and FIG. 6, a small-sized high-frequency amplifier can be manufactured at a low cost.

In the first to third embodiments, the T-type circuit 12, the π-type circuit 24 and the ladder-type circuit 33 are used as stabilizing circuits. However, the present invention is not limited to these circuits. That is to say, it is applicable that a set of a series resistor and a parallel resistor arranged on the output side of the amplifier 3 be used as a stabilizing circuit.

Embodiment 4

Figure 13:
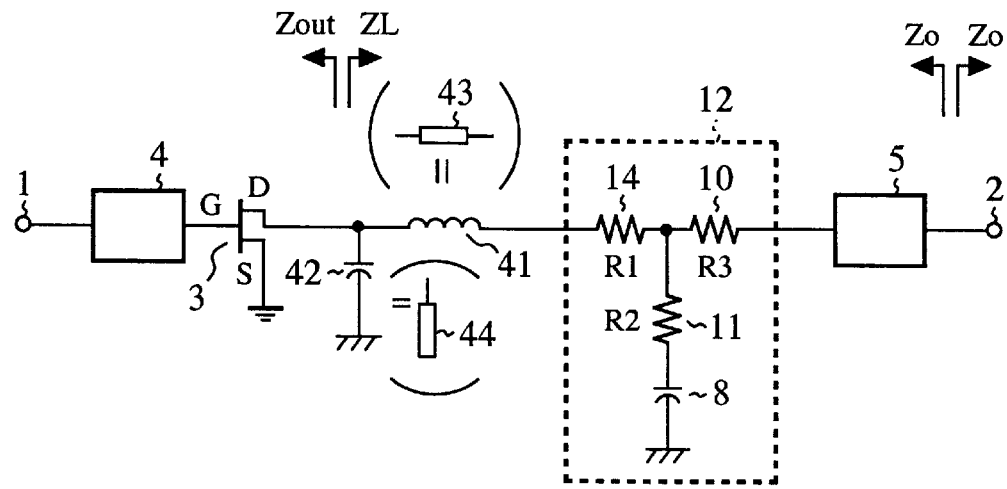
FIG. 13 is a view showing the configuration of a high-frequency amplifier according to a fourth embodiment of the present invention.

FIG. 13 is a view showing the configuration of a high-frequency amplifier according to a fourth embodiment of the present invention. The constituent elements, which are the same as those shown in FIG. 1, are indicated by the same reference numerals as those of the constituent elements shown in FIG. 1, and additional description of those constituent elements is omitted.

In FIG. 13, 41 indicates an inductor (or a series inductor) serially arranged between the amplifier 3 and the T-type circuit 12. 42 indicates a condenser (or a parallel condenser) placed on the input side of the inductor 41 so as to be arranged in parallel to the inductor 41. 43 indicates a distribution constant line (or a series inductor) arranged in place of the inductor 41. 44 indicates an open stub (or a parallel condenser) arranged in place of the condenser 42.

Next, an operation of the high-frequency amplifier will be described below.

The high-frequency amplifier of the fourth embodiment differs from that of the first embodiment in that the inductor 41 of the serial arrangement and the condenser 42 of the parallel arrangement are additionally inserted into the high-frequency amplifier between the amplifier 3 and the T-type circuit 12.

In the same manner as in the high-frequency amplifier of the first embodiment, an input-side bias is applied to the input signal in an input-side bias circuit arranged in the input matching circuit 4, and an output-side bias is applied to the amplified signal through the parallel resistor 11 of the T-type circuit 12 functioning as a stabilizing circuit. Here, it is applicable that the output-side bias be applied to the amplified signal in an inductor or a line for bias feed arranged between the T-type circuit 12 and the amplifier 3. Also, it is applicable that the output-side bias be applied to the amplified signal in a bias circuit arranged in the output matching circuit 5.

Because the T-type circuit 12 functioning as a stabilizing circuit is arranged in the high-frequency amplifier, the input signal can be amplified without an unstable operation such as oscillation. Also, because the T-type circuit 12 having the series resistors 14 and 10 and the parallel resistor 11 is inserted into the high-frequency amplifier on the output side of the amplifier 3, a low noise characteristic can be obtained in the high-frequency amplifier.

Here, the condenser 8 is arranged to cut a direct current. However, it is applicable that a condenser be arranged between the series resistor 14 and the amplifier 3 to cut a direct current in place of the condenser 8. Also, it is applicable that a condenser be arranged between the series resistor 14 and the parallel resistor 11 to cut a direct current in place of the condenser 8. Also, in cases where the resistance value R2 of the parallel resistor 11 is sufficiently high so as to sufficiently lower a current flowing the parallel resistor 11, the increase of an electric power consumed in the parallel resistor 11 can be disregarded. Therefore, in this case, the condenser 8 is not required.

In the configuration shown in FIG. 13, because the T-type circuit 12 having the series resistors 14 and 10 and the parallel resistor 11 functions as a stabilizing circuit, even though an output impedance obtained by seeing the amplifier 3 and the T-type circuit 12 from the output matching circuit 5 is matched to a characteristic impedance Zo in the output matching circuit 5, an output load impedance ZL obtained by seeing the output side of the high-frequency amplifier from the amplifier 3 can be appropriately set to a value higher or lower than or equal to a value of an impedance Zout* conjugated to the complex number of the output impedance Zout of the amplifier 3. In this case, only the output load impedance ZL obtained by seeing the output side of the high-frequency amplifier from the amplifier 3 can be changed on condition that a gain of the high-frequency amplifier, or an electric power floss on the output side of the amplifier 3, and a noise characteristic are maintained.

Figure 14:
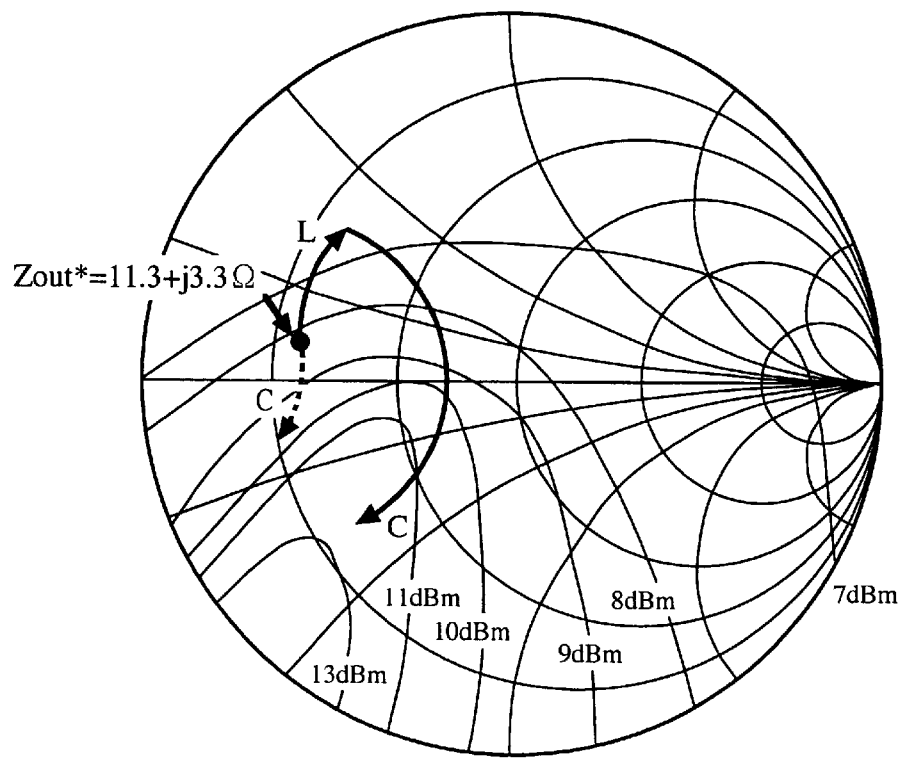
FIG. 14 shows a relation between a third input intercept point (IIP3) and an output load impedance obtained-by seeing the output side of the high-frequency amplifier from an FET.

FIG. 14 shows a relation between the third input intercept point (IIP3) and the output load impedance ZL obtained by seeing the output side of the high-frequency amplifier from the FET denoting the amplifier 3. A value of the inductor 41 is expressed by a symbol L, and a value of the condenser 42 is expressed by a symbol C.

The calculation is performed at a frequency of 900 MHz by using a large signal model of a field effect transistor (FET) having a gate width of 5.8 mm as the amplifier 3. In this calculation, the input matching circuit 4 is arranged on the input side of the high-frequency amplifier, but the output matching circuit 5 is not arranged on the output side of the high-frequency amplifier. Therefore, the T-type circuit 12 having the resistors is arranged on the output side of the high-frequency amplifier and is directly connected to a load element of the characteristic impedance Zo. The output impedance Zout of the FET in the setting bias condition is set to 11.1–j3.3 Ω. As shown in FIG. 14, the output electric power (P1dB) is maximized at an impedance value, which is lower than the value 11.1–j3.3 Ω of the output impedance Zout of the FET, in case of a capacitive reactance.

In the high-frequency amplifier shown in FIG. 13, the inductor 41 of the serial arrangement and the condenser 42 of the parallel arrangement are inserted into the high-frequency amplifier between the amplifier 3 and the T-type circuit 12. Therefore, as shown in FIG. 14, when the value L of the inductor 41 and the value C of the condenser 42 are appropriately set, the output load impedance ZL obtained by seeing the output side of the high-frequency amplifier from the FET denoting the amplifier 3 can approach an impedance value (indicated by arrows of thick lines in FIG. 14) so as to heighten the third input intercept point (IIP3). Accordingly, in the high-frequency amplifier of the fourth embodiment, the third input intercept point (IIP3) higher than that in the first embodiment can be obtained, and a characteristic for further lowering the distortion of the output signal can be obtained as compared with that in the first embodiment.

In this embodiment, as shown in FIG. 13, it is applicable that the distribution constant line 43 be serially arranged in place of the inductor 41, and it is applicable that the open stub 44 be arranged in place of the condenser 42. In this case, no inductor or no condenser is used, but the distribution constant line 43 and the open stub 44 can be formed of wires arranged on a substrate. Therefore, the high-frequency amplifier can be manufactured at a low cost.

Also, in this embodiment, the T-type circuit 12 is used as a stabilizing circuit. However, it is applicable that the π-type circuit 24 shown in FIG. 6 or the ladder-type circuit 33 shown in FIG. 11 be used in place of the T-type circuit 12. In this case, the same characteristics as those obtained by using the T-type circuit 12 can be obtained.

Also, in this embodiment, even though the inductor 41 is not arranged in the high-frequency circuit, as shown by an arrow of a dotted line in FIG. 14, the output load impedance ZL can be adjusted, and the characteristic for further lowering the distortion of the output signal can be obtained. In this case, because the inductor 41 is not arranged in the high-frequency circuit, a small-sized high-frequency amplifier can be manufactured at a low cost.

Embodiment 5

Figure 15:
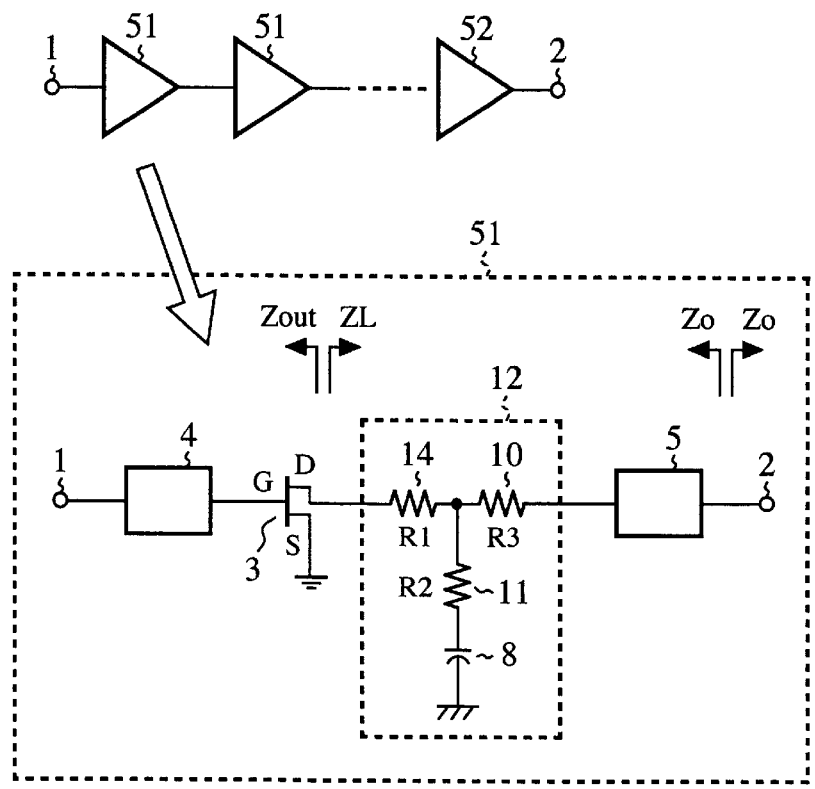
FIG. 15 is a view showing the configuration of a high-frequency multistage amplifier according to a fifth embodiment of the present invention.

FIG. 15 is a view showing the configuration of a high-frequency multistage amplifier according to a fifth embodiment of the present invention. The constituent elements, which are the same as those shown in FIG. 1, are indicated by the same reference numerals as those of the constituent elements shown in FIG. 1, and additional description of those constituent elements is omitted.

In FIG. 15, 51 indicates the high-frequency amplifier shown in FIG. 1. 52 indicates a general high-frequency amplifier arranged in the final stage of a high-frequency multistage amplifier. The high-frequency multistage amplifier comprises the high-frequency amplifiers 51 and the general high-frequency amplifier 52 (or the general high-frequency amplifiers 52) serially arranged.

Next, an operation of the high-frequency multistage amplifier will be described below.

A signal input to the input terminal 1 is amplified in each high-frequency amplifier 51 in which the T-type circuit 12 having the series resistors 14 and 10 and the parallel resistor 11 is arranged as a stabilizing circuit. Thereafter, the signal is amplified in each general high-frequency amplifier 52, and the signal is output from the output terminal 2.

Therefore, though a high-frequency amplifier arranged in the first stage of the high-frequency multistage amplifier has a high influence on the noise generated in the signal, because the high-frequency amplifier 51, in which the T-type circuit 12 having the series resistors 14 and 10 and the parallel resistor 11 is arranged as a stabilizing circuit to obtain the low noise characteristic, is used as the high-frequency amplifier of the first stage, the noise of the signal output from the high-frequency multistage amplifier can be lowered.

Also, because the high-frequency amplifiers 51 having the characteristics of the high output electric power and the low distortion are used as the high-frequency amplifiers of the first and second stages, the signal output from the high-frequency multistage amplifier can have the high output electric power and the low distortion. Also, because the signal output from the high-frequency multistage amplifier has the high output electric power, the high-frequency multistage amplifier can be operated at a high efficiency.

Also, the high-frequency amplifier 51 has the characteristics of the high efficiency, the high output electric power and the low noise by arranging the T-type circuit 12 having the series resistors 14 and 10 and the parallel resistor 11 as a stabilizing circuit. Therefore, in cases where the high-frequency amplifier 51 is used as the high-frequency amplifier of the first stage or each of the high-frequency amplifiers arranged in the first stage and another stage (or other stages) near to the first stage, the high-frequency multistage amplifier having the characteristics of the high efficiency, the high output electric power and the low noise can be obtained.

Also, in cases where the high-frequency amplifier 51 having the low noise characteristic is arranged in each of all stages of the high-frequency multistage amplifier, the high-frequency multistage amplifier having the lowest noise characteristic can be obtained, and the high-frequency multistage amplifier having the characteristics of the higher output electric power and the lower distortion can be obtained.

In the fifth embodiment, the high-frequency amplifier 51 having the T-type circuit 12 as a stabilizing circuit is used for the high-frequency multistage amplifier. However, it is applicable that the high-frequency amplifier having the π-type circuit 24 shown in FIG. 6 or the ladder-type circuit 33 shown in FIG. 11 be used for the high-frequency multistage amplifier in place of the high-frequency amplifier having the T-type circuit 12. Also, it is applicable that the high-frequency amplifier additionally having the inductor 41 and the condenser 42 shown in FIG. 13 be used for the high-frequency multistage amplifier. In this case, the same characteristics as those obtained in the high-frequency multistage amplifier shown in FIG. 15 can be obtained.

What is claimed is:

1. A low noise high-frequency amplifier comprising:
    an amplifier for amplifying an input signal; and
    a stabilizing circuit, which is arranged only on an output side of the amplifier directly connected thereto and has a series resistor and a parallel resistor, for stabilizing the amplification of the input signal performed in the amplifier and outputting the amplified input signal.

2. The low noise high-frequency amplifier according to claim 1 wherein the stabilizing circuit is formed of a T-type circuit having a first series resistor, a second series resistor and the parallel resistor and having an impedance which is set in a value such that an output load impedance of the amplifier is a value near to or slightly lower than a value of the conjugate complex impedance of the output impedance of the amplifier.

3. The low noise high-frequency amplifier according to claim 1 wherein the stabilizing circuit is formed of a n-type circuit having the series resistor, a first parallel resistor and a second parallel resistor.

4. The low noise high-frequency amplifier according to claim 1 wherein the stabilizing circuit is formed of a ladder-type circuit having the series resistor and the parallel resistor.

5. The low noise high-frequency amplifier according to claim 1, further comprising:
    a series inductor arranged between the amplifier and the stabilizing circuit; and
    a parallel condenser arranged between the amplifier and the stabilizing circuit, both of which are directly coupled to the amplifier.

6. A low noise high-frequency multistage amplifier, comprising:
    a specific high-frequency amplifier, arranged in a first stage, for amplifying an input signal: and
    a general high-frequency amplifier, arranged in a stage following the first stage, for amplifying the input signal amplified by the specific high-frequency amplifier and outputting the amplified input signal as an output signal, and
    the specific high-frequency amplifier comprises
        an amplifier for amplifying the input signal; and
        a stabilizing circuit, which is arranged only on an output side of the amplifier directly connected thereto and has a series resistor and a parallel resistor, for stabilizing the amplification of the input signal performed in the amplifier.

7. The low noise high-frequency multistage amplifier according to claim 6 wherein the stabilizing circuit of the specific high-frequency amplifier is formed of a T-type circuit having a first series resistor, a second series resistor and the parallel resistor having an impedance which is set in a value such that an output load impedance of the amplifier is a value near to or slightly lower than a value of the conjugate complex impedance of the output impedance of the amplifier.

8. The low noise low-frequency multistage amplifier according to claim 6 wherein the stabilizing circuit of the specific high-frequency amplifier is formed of a n-type circuit having the series resistor, a first parallel resistor and a second parallel resistor.

9. The low noise high-frequency multistage amplifier according to claim 6 wherein the stabilizing circuit of the specific high-frequency amplifier is formed of a ladder-type circuit having the series resistor and the parallel resistor.

* * * * *